(12) United States Patent
Ito (10) Patent No.: US 8,017,525 B2
(45) Date of Patent: Sep. 13, 2011

(54) PROCESSING METHOD (75) Inventor: Takashi Ito, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 405 days.

(21) Appl. No.: 12/238,066

(22) Filed: Sep. 25, 2008

(65) Prior Publication Data
US 2009/0026171 A1 Jan. 29, 2009

Related U.S. Application Data (62) Division of application No. 10/814,258, filed on Apr. 1, 2004, now abandoned.

(30) Foreign Application Priority Data

Apr. 1, 2003 (JP) .................................. 2003-098162

(51) Int. Cl.
H01L 21/302 (2006.01)

(52) U.S. Cl. ............ 438/708; 438/706; 438/714; 216/62

(58) Field of Classification Search .................. 438/706, 438/710, 712, 714, 716, 708; 118/500, 723 MP, 118/723 E; 216/62, 66
See application file for complete search history.

(56) References Cited

U.S. PATENT DOCUMENTS

| 5,364,667 A | 11/1994 | Rhieu |
| 5,522,934 A | 6/1996 | Suzuki et al. |
| 5,838,121 A | 11/1998 | Fairbairn et al. |
| 6,086,679 A | 7/2000 | Lee et al. |
| 6,143,081 A * | 11/2000 | Shinriki et al. ............... 118/719 |
| 6,174,370 B1 * | 1/2001 | Yoshida ......................... 118/500 |
| 6,475,930 B1 * | 11/2002 | Junker et al. .................. 438/787 |

FOREIGN PATENT DOCUMENTS

| JP | 6-177087 | 6/1994 |
| JP | 7-201749 | 8/1995 |
| JP | 10-163197 | 6/1998 |
| JP | 2000-311893 | 11/2000 |
| JP | 2001-176870 | 6/2001 |
| JP | 2001-250929 | 9/2001 |
| JP | 2002-151468 | 5/2002 |

* cited by examiner

Primary Examiner — Lan Vinh
(74) Attorney, Agent, or Firm — Oblon, Spivak, McClelland, Maier & Neustadt, L.L.P.

(57) ABSTRACT

A multichamber-type processing apparatus and processing method using same, in which a substrate is reliably neutralized without being damaged, thereby ensuring excellent accuracy and throughput. The processing apparatus includes a transfer chamber, etching chambers selectively communicating with the transfer chamber and providing a space to etch a first substrate therein, and ashing chambers selectively communicating with the transfer chamber and providing a space to ash a second substrate therein. A transfer mechanism is installed in the transfer chamber to sequentially transfer the substrate from the transfer chamber into the etching and ashing chambers. The substrate is electrostatically adsorbed to electrostatic chucks in the etching and ashing chambers. An monatomic nitrogen atom supply unit supplies dissociated monatomic nitrogen atoms into the etching and ashing chambers.

12 Claims, 7 Drawing Sheets

PROCESSING METHOD

CROSS-REFERENCE TO RELATED APPLICATIONS

The present application is a division of application Ser. No. 10/814,258, filed on Apr. 1, 2004, which claims benefit of Japanese Patent Application No. 2003-098162 filed on Apr. 1, 2003. The entire contents of application Ser. No. 10/814,258 is incorporated hereinto by reference.

FIELD OF THE INVENTION

The present invention relates to a multichamber-type processing apparatus having an arrangement in which a transfer chamber is coupled to a plurality of processing chambers for etching or ashing a substrate to be processed, and a processing method using same.

BACKGROUND OF THE INVENTION

Generally, a multichamber-type processing apparatus, which includes a transfer chamber provided with a transfer arm and coupled to a plurality of processing chambers via gate valves, is known as a processing apparatus for performing etching, ashing, and deposition processes on a plurality of substrates, such as semiconductor wafers or glass substrates, producing high throughput. (see Japanese Patent Laid-open Publication No. 1994-31471)

An electrostatic chuck is frequently used as a jig to electrostatically adsorb a substrate to be processed, such as a semiconductor wafer in a processing chamber. Such electrostatic chuck incorporates therein an electrode embedded in a dielectric member, and by applying a direct current to the electrode the substrate is electrostatically adsorbed to a surface of the dielectric member by an electrostatic force, such as a Johnsen-Rahbek force or a Coulomb force.

In case that the substrate is adsorbed to the electrostatic chuck, a small amount of electric charge still remains in the substrate even after the application of the direct current to the electrode is stopped after the substrate is processed. The electric charge remaining on a surface of the substrate in the multichamber-type processing apparatus becomes an issue when transferring a substrate from a processing chamber to another processing chamber by use of the transfer arm. That is, the substrate becomes misaligned on the transfer arm when the transfer arm mounts thereon the substrate from the electrostatic chuck. Hence, when the substrate is transferred from the transfer arm to a processing chamber, the substrate is placed at a misaligned position in the processing chamber. Additionally, such condition also suffers from that it takes a relatively longer amount of time to separate the substrate from the electrostatic chuck, which in turn deteriorates throughput efficiency of the multichamber-type processing apparatus.

In order to eliminate such ill effects thereof, the charge on the substrate needs to be neutralized. For instance, there are a method of applying a current having an opposite polarity to the current applied to an electrode when a substrate is electrostatically adsorbed to an electrostatic chuck as disclosed in Japanese Patent Laid-open Publication 1997-213780 and a method of neutralizing charge on an object to be processed which is electrostatically adsorbed to an electrostatic chuck, by supplying ionized processing gas thereto as disclosed in Japanese Patent Laid-open Publication No. 1994-275546.

However, there are drawbacks associated with the method disclosed in Japanese Patent Laid-open Publication No. 1997-213780. In such method, it is difficult to apply the current to the substrate so as to precisely neutralize the electric charge, and thus either positive or negative electric charge still remains on a surface of the substrate when a desired valance is not obtained, reducing neutralization of the substrate.

Furthermore, in case of employing the process disclosed in Japanese Patent Laid-open Publication No. 1994-275546 there is a concern for damages incurring on the substrate such as the semiconductor wafer, by the ionized processing gas supplied thereto.

SUMMARY OF THE INVENTION

It is, therefore, an object of the present invention to provide a multichamber-type processing apparatus and a processing method using same, which reliably neutralizes a charge on a substrate without incurring damage to the substrate, thereby ensuring excellent accuracy and throughput.

In accordance with one aspect of the present invention, there is provided a processing apparatus including: a transfer chamber; a plurality of processing chambers for processing therein a substrate to be processed, the processing chambers being coupled to the transfer chamber; a number of electrostatic chucks which are provided in the processing chambers, to electrostatically adsorb the substrate to be processed thereto; a transfer mechanism installed in the transfer chamber to transfer the substrate to be processed between the processing chambers and the transfer chamber; and a monatomic nitrogen atom supply unit for supplying dissociated monatomic nitrogen N (hereinafter N) atoms into the processing chambers.

In accordance with another aspect of the present invention, there is provided a processing apparatus including: a transfer chamber; a first processing chamber coupled to the transfer chamber, the first processing chamber performing therein a first process on a substrate to be processed; a second processing chamber coupled to the transfer chamber, the second processing chamber performing therein a second process on the substrate to be processed; a transfer mechanism installed in the transfer chamber for sequentially transferring the substrate to be processed into the first and second processing chamber; electrostatic chucks provided in the first and the second processing chambers, the electrostatic chucks electrostatically adsorbing thereto the substrate to be processed; and a monatomic nitrogen atom supply unit for supplying dissociated monatomic N atoms into the first and second processing chamber.

In accordance with still another aspect of the present, there is provided a processing method employing a processing apparatus, which includes a transfer chamber, a plurality of processing chambers coupled to the transfer chamber, to process therein a target substrate, and a number of electrostatic chucks provided in the processing chambers to electrostatically adsorb the target substrate thereto, including the steps of: transferring the target substrate from the transfer chamber into one of the processing chambers by using a transfer mechanism; placing the target substrate on an electrostatic chuck displaced in said one processing chamber; applying a direct current to an electrode embedded in the electrostatic chuck to electrostatically absorb the target substrate to the electrostatic chuck; processing the target substrate in said one processing chamber, to thereby obtain a processed substrate; terminating the application of the direct current to the electrostatic chuck; supplying dissociated monatomic N atoms into said one processing chamber to remove charge on the electrostatic chuck; and transferring the processed substrate into the transfer chamber using the transfer mechanism.

In accordance with yet still another aspect of the invention, there is provided a processing method using a processing apparatus, which includes a transfer chamber, a first processing chamber coupled to the transfer chamber, for performing a first process on a target substrate therein, a second processing chamber coupled to the transfer chamber for performing a second process on the target substrate therein, and a first and second electrostatic chucks provided in the first and second processing chambers, respectively, to electrostatically adsorb the substrate thereto, including the steps of: transferring the target substrate from the transfer chamber into the first processing chamber using a transfer mechanism; placing the target substrate on the first electrostatic chuck in the first processing chamber; applying a direct current to an electrode of the first electrostatic chuck to electrostatically adsorb the target substrate to the first electrostatic chuck; performing a first process on the target substrate in the first processing chamber to thereby obtain a processed substrate; terminating the application of the direct current to the first electrostatic chuck; supplying dissociated monatomic N atoms into the first processing chamber to remove charge on the first electrostatic chuck; transferring the processed substrate into the transfer chamber using the transfer mechanism; transferring the processed substrate from the transfer chamber into the second processing chamber; placing the processed substrate on the second electrostatic chuck in the second processing chamber; applying the direct current to an electrode of the second electrostatic chuck to electrostatically adsorb the processed substrate to the second electrostatic chuck; and performing a second process on the processed substrate in the processed second processing chamber.

In the present invention, N was employed, however, there are elements such as F, O, and Cl that have the electronegativity greater than or equivalent to that of N. Since, however, F reacts with $SiO_2$ formed on the substrate; O reacts with a resist; and Cl reacts with Si, N is preferred over F, O, and Cl. Furthermore, N is a non-toxic, non-explosive, incombustible, and relatively cheap substance. Moreover, its treatment is relatively easy, which makes N more of a preferred choice over the other elements.

In the present invention it is preferable that the dissociated monatomic N atoms be supplied near the electrostatic chuck, thereby reliably removing a charge on a substrate adsorbed to the electrostatic chuck.

Additionally, a charge on a substrate supporting unit of a transfer mechanism or on the substrate mounted thereon may be removed by supplying the dissociated monatomic N atoms into the transfer chamber, thereby further preventing ill effects of electric charge.

Furthermore, a charge on the substrate is removed at a desired time by controlling a supply timing of the dissociated monatomic N atoms, to effectively remove charge on the substrate.

Moreover, the energy supply unit may include an ultraviolet irradiation unit for irradiating ultraviolet ray to the $N_2$ gas. In addition, a portion of a pipe may be made of a dielectric material, and an induction coil as the energy supply unit may be wound around the dielectric portion of the pipe, wherein a high frequency source applies a high frequency to the induction coil. As a result, the dissociated monatomic N atoms are conveniently obtained.

Furthermore, the dissociated monatomic N atoms may be effectively generated by applying energy, higher than dissociation energy of the $N_2$ gas and lower than ionization energy of the $N_2$ gas, to the $N_2$ gas. When the energy applied to the $N_2$ gas is lower than the dissociation energy, the $N_2$ gas is not dissociated into the monatomic N atoms. On the other hand, when the energy applied to the $N_2$ gas is higher than the ionization energy, more N ions are generated than the dissociated monatomic N atoms, which damages the substrate.

BRIEF DESCRIPTION OF DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Hereinafter, the preferred embodiments of the present invention will now be described in reference to the accompanying drawings.

Figure 1:
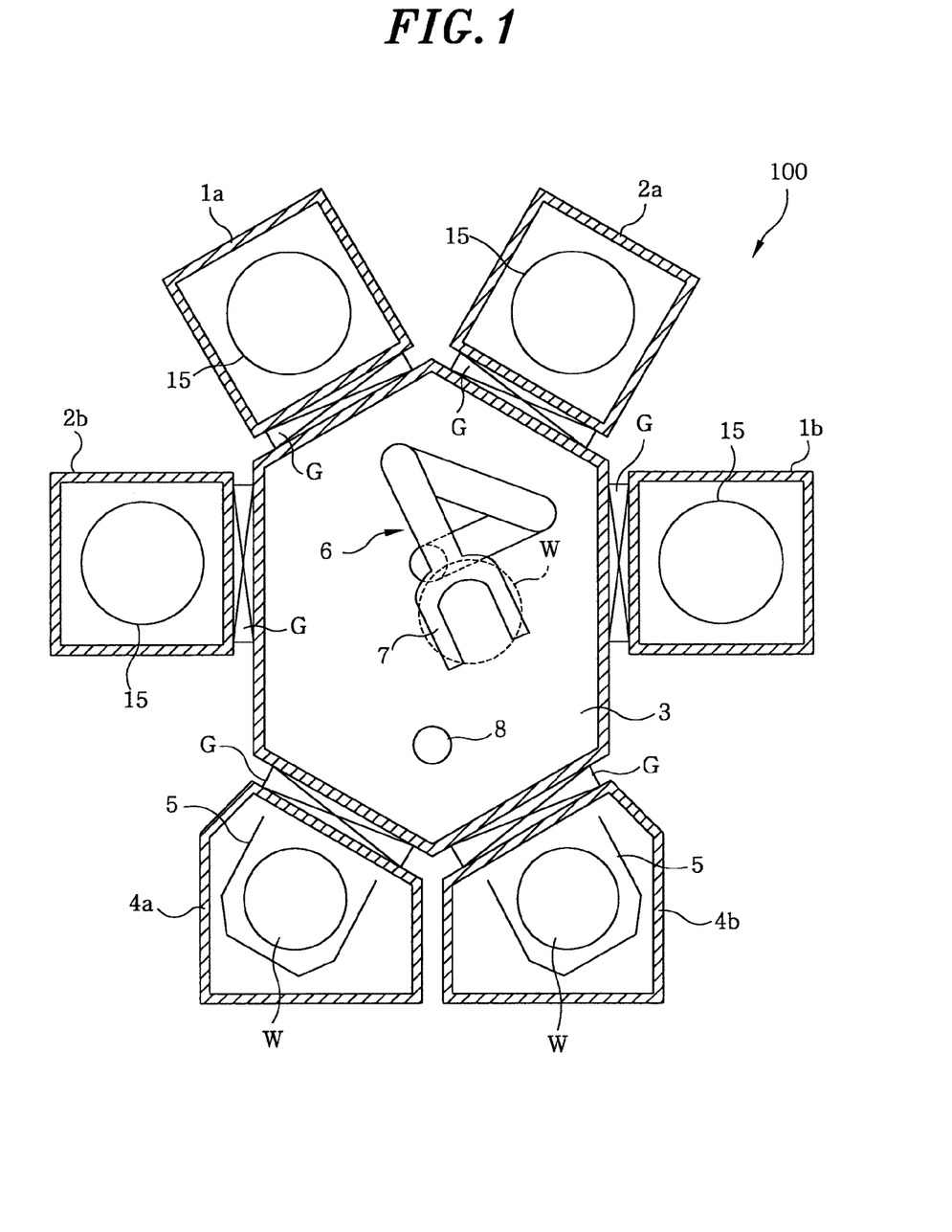
FIG. 1 schematically illustrates a multichamber-type processing apparatus in accordance with the first embodiment of the present invention.

There is schematically illustrated in FIG. 1 a vacuum processing apparatus in accordance with a first embodiment of the present invention. The vacuum processing apparatus is a multichamber-type processing apparatus used in etching and ashing processes, for etching and ashing an object to be processed, such as a semiconductor wafer (hereinafter, referred to as "wafer") under a predetermined level of vacuum.

As shown in FIG. 1, the multichamber-type processing apparatus 100 includes two etching chambers 1a, 1b for etching the wafer W, and two ashing chambers 2a, 2b for ashing the wafer W, wherein the etching and ashing chambers 1a, 1b, 2a, 2b are mounted on four sides of a hexagonal transfer chamber 3, respectively. The two remaining sides of the hexagonal transfer chamber 3 are provided with wafer cassette chambers 4a, 4b, respectively, which accommodate therein a cassette 5 having a plurality of wafers W mounted therein. Each of the etching chambers 1a, 1b and the ashing chambers 2a, 2b includes a susceptor 15 on which the wafers W mounted.

The etching chambers 1a, 1b, ashing chambers 2a, 2b, and wafer cassette chambers 4a, 4b are connected to the respective sides of the transfer chamber 3 via respective gate valves G as shown in FIG. 1 such that by opening the gate valve G the corresponding chamber communicates with the transfer chamber 3, and by shutting the gate valve G, the corresponding chamber becomes isolated.

Furthermore, a wafer transfer mechanism 6 is installed in the transfer chamber 3 to take the object to be processed, e.g., wafer W, out of and into the etching chambers 1a, 1b, ashing chambers 2a, 2b, and wafer cassette chambers 4a, 4b. The wafer transfer mechanism 6 is positioned at a substantially center portion of the transfer chamber 3, and has a multi-joint arm structure. In particular, there is provided a hand 7 at an end portion thereof on which the wafer W is mounted to carry the wafer W. In addition, an aligning unit 8 is installed near the wafer cassette chambers 4a, 4b in the transfer chamber 3 to align the wafers W.

Corresponding to process requirements of etching and ashing of the wafers W which are to be conducted under a predetermine level of vacuum, the etching chambers 1a, 1b, the ashing chambers 2a, 2b, and the transfer chamber 3 are all maintained under predetermined vacuum conditions. As for the wafer cassette chambers 4a, 4b, when cassettes 5 are transferred into and from the wafer cassette chambers 4a, 4b through openings (not shown) provided at the wafer cassette chambers 4a, 4b, an atmospheric pressure is established therein, however when the cassettes 5 are loaded in the cassette chambers 4a, 4b for processing, the cassette chambers 4a, 4b are under a predetermined level of vacuum.

Hereinafter, a detailed description of the etching chambers 1a, 1b will now be given in detail.

Figure 2:
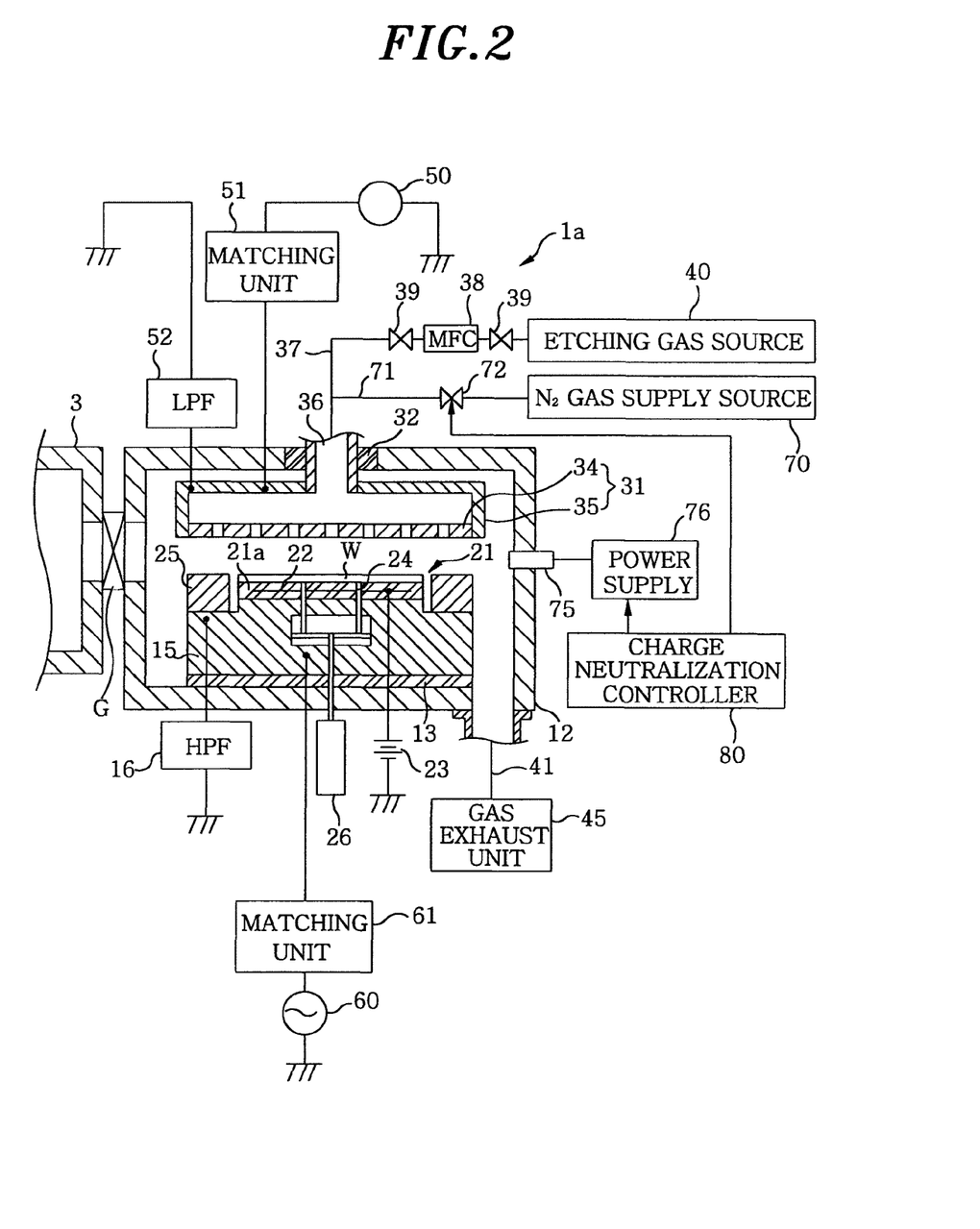
FIG. 2 sets forth an etching chamber provided in the multichamber-type processing apparatus shown in FIG. 1.

FIG. 2 illustrates an etching chamber 1a. The etching chamber 1a includes a chamber 12 made of a metal, such as aluminum having a surface thereof oxidized, wherein the chamber 12 is frame-grounded. A susceptor 15 serving as a lower electrode of a plate electrode is provided on the floor of the chamber 12 via an insulator 13. Further, the susceptor 15 is connected to a high pass filter 16 (HPF).

An electrostatic chuck 21 having the wafer W mounted thereon is provided on the susceptor 15, and electrostatically adsorbs the wafer W thereto, to thereby prevent the wafer W from being moved on the electrostatic chuck 21. In this respect, the electrostatic chuck 21 is structured such that an electrode 22 is embedded in a dielectric member 21a. When a direct current is applied to the electrode 22 from a direct current (DC) power supply 23 connected to the electrode 22, the wafer W is electrostatically adsorbed to the electrostatic chuck 21 by an electrostatic force, such as a Johnsen-Rahbek force or a Coulomb force. Furthermore, a focus ring 25 made of Si is provided to surround the wafer W, to thereby enhance uniformity in etching of the wafer W. Moreover, lift pins 24 are elevatably installed in the susceptor 15 to be penetrated through a surface of the electrostatic chuck 21, and are vertically moved by a cylinder 26.

A shower head 31 facing the susceptor 15 is installed thereabove to supply a gas into the chamber 12. The shower head 31 serves as an upper electrode, and is supported in an upper part of the chamber 12 through the insulator 32. In addition, the shower head 31 includes an electrode plate 34 having a plurality of holes and a supporting member 35 for supporting the electrode plate 34.

A gas inlet 36 is formed at a substantially center portion of an upper part of the supporting member 35, and is connected to one of two ends of a gas supply line 37, whereas the other end of the gas supply line 37 is connected to an etching gas source 40 via a mass flow controller 38. Valves 39 are positioned at both an inlet and outlet side of the mass flow controller 38 installed at the gas supply line 37. An etching gas including, for example, a halogen element F, is supplied from the etching gas source 40 to the chamber 12 through the shower head 31.

An exhaust line 41 connected to a gas exhaust unit 45 is provided at a bottom portion of the chamber 12. Additionally, a gate valve G is installed at a sidewall of the chamber 12 so that the wafer W can be transferred between the chamber 12 and the neighboring transfer chamber 3.

The shower head 31 serving as the upper electrode is connected to a low pass filter (LPF) 52 and a high frequency power supply 50 via a matching unit 51. The susceptor 15 serving as the lower electrode is connected to a high frequency power supply 60 via a matching unit 61.

One end of a gas line 71 is connected to the gas supply line 37, and the other end thereof is connected to a $N_2$ gas supply source 70 for supplying an $N_2$ gas used as a charge removal gas into the chamber 12. A valve 72 is installed at the gas line 71. Further, an ultraviolet irradiation unit 75 including an ultraviolet irradiation lamp is provided at the sidewall of the chamber 12 such that the ultraviolet irradiation unit 75 is positioned close to the electrostatic chuck 21, and is connected to an ultraviolet irradiation power supply 76. The valve 72 and ultraviolet irradiation power supply 76 are controlled by a charge removal controller 80. In other words, the charge removal controller 80 signals the valve 72 to be opened at a predetermined timing to supply the $N_2$ gas from the $N_2$ gas supply source 70 through the shower head 31 into the chamber 12. Simultaneously, the charge removal controller 80 signals the ultraviolet irradiation power supply 76 to be turned on at a predetermined timing to irradiate ultraviolet ray from the ultraviolet irradiation unit 75 to the $N_2$ gas, thereby dissociating and converting the $N_2$ gas to monatomic N atoms in the chamber 12. The monatomic N atoms contribute to charge removal of the wafers W electrically charged on the electrostatic chuck 21.

An etching chamber 1b has the same structure as the etching chamber 1a. Furthermore, the ashing chambers 2a, 2b each have the same structure as the etching chamber 1a with a minor exception of, e.g., using $O_2$ gas as an ashing gas and a processing pressure different from that of the etching chamber 1a.

Hereinafter, a detailed description will now be given for an operation of the multichamber-type processing apparatus 100. In this respect, there will be described a process of forming via holes and trenches on a low-k film on a Cu wire by a dual damascene technique in which via holes and trenches are first etched followed by an ashing.

Figure 3A:
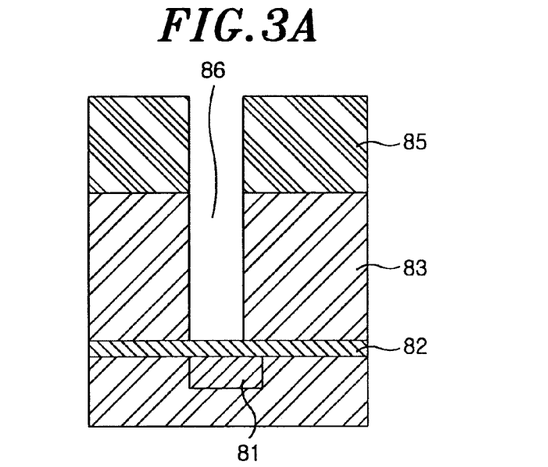
FIGS. 3A to 3C are cross sectional views illustrating the etching and ashing of a substrate using the multichamber-type processing apparatus shown in FIG. 1.
Figure 3B:
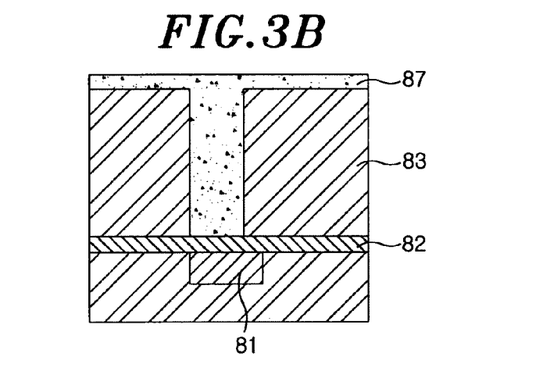
Figure 3C:
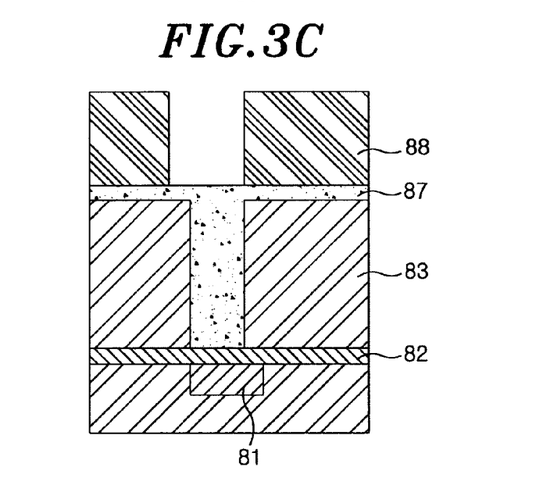

In reference to FIG. 3A, a liner layer 82 made of SiN or SiC is formed on a bottom layer, i.e., Cu wire 81, and a low-k film 83 is formed thereon. With such structure, a via hole 86 is formed in the low-k film 83 by employing a resist film 85 as a mask. Then, the first resist film 85 is removed from the structure by an ashing process and a sacrificial film 87 is formed, as shown in FIG. 3B. In FIG. 3C, a resist film 88 to be used in a trench etching process is formed on the sacrificial film 87. Thus formed structure is subject to the etching and ashing processes in the multichamber-type processing apparatus 100 in accordance with to the present invention.

Figure 4:
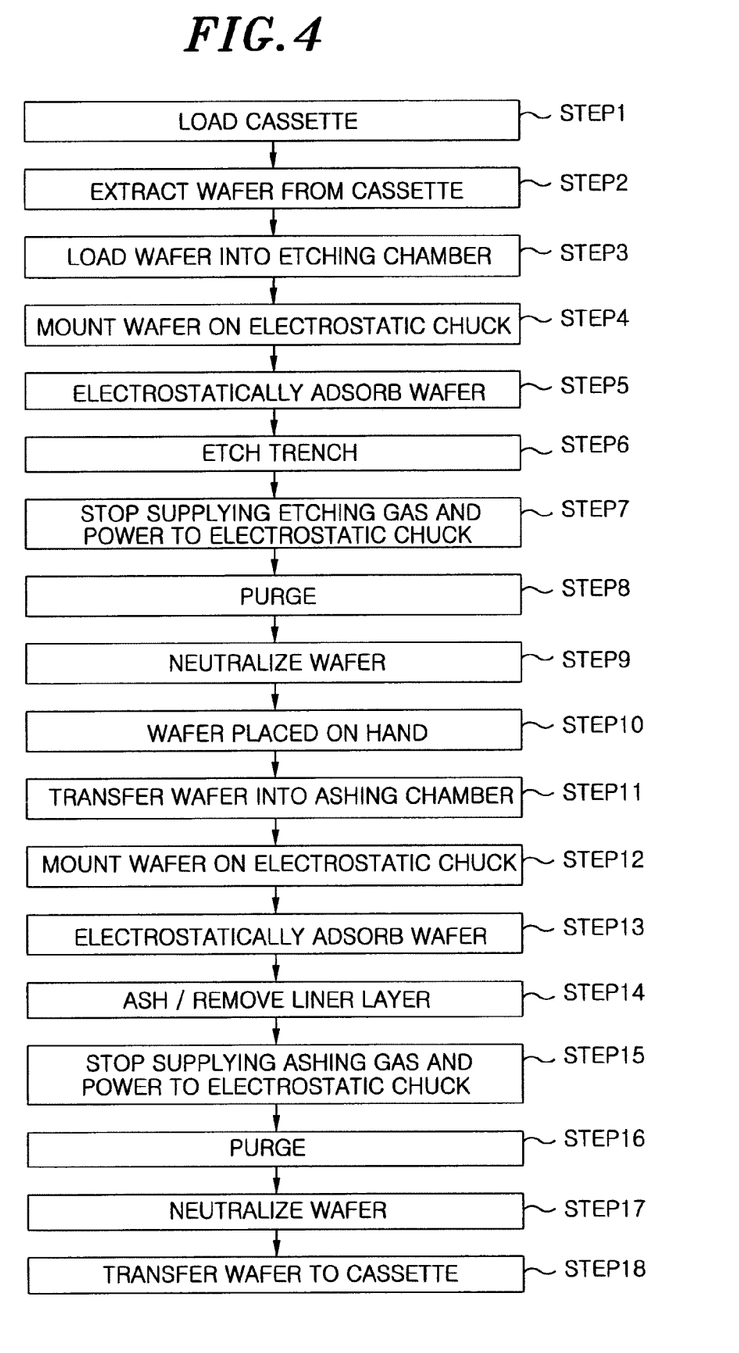
FIG. 4 is a flow chart describing the etching and ashing of the substrate using the multichamber-type processing apparatus shown in FIG. 1.

In reference to FIG. 4, the cassette 5 is loaded into one or both of the wafer cassette chambers 4a, 4b of the multichamber-type processing apparatus 100 (step 1). In this regard, the wafers W may be mounted in both cassettes 5 of the wafer cassette chambers 4a, 4b, or in just one cassette 5 of the wafer cassette chambers 4a, 4b, leaving the other cassette 5 empty. At this time, ambient pressures of the transfer chamber 3, etching chambers 1a, 1b, and ashing chambers 2a, 2b are under predetermined vacuum levels. However, when the cassettes 5 are transferred into the wafer cassette chambers 4a, 4b, the ambient pressure of the wafer cassette chambers 4a, 4b becomes atmospheric, but prior to processing of the wafer W, the wafer cassette chambers 4a, 4b are evacuated, thereby establishing predetermined vacuum levels therein.

The hand 7 of the wafer transfer mechanism 6 of the transfer chamber 3 enters one of the wafer cassette chambers 4a or 4b, and a single wafer W is placed on the hand 7 (step 2). The wafer transfer mechanism 6 transfers the wafer W to a position in the transfer chamber 3 adjacent to the etching chamber 1a while carrying the wafer W on the hand 7, the gate valve G between the etching chamber 1a and the transfer chamber 3 is opened, and the wafer W is transferred into the etching chamber 1a (step 3). The wafer W is then mounted on an electrostatic chuck 21 in the etching chamber 1a (step 4). Specifically, the hand 7 transfers the wafer W onto the lift pin 24 protruding from the electrostatic chuck 21, and after the hand 7 is retracted from the etching chamber 1a out to the transfer chamber 3 the lift pin 24 is then lowered, to place the wafer W on the electrostatic chuck 21.

After the hand 7 is retracted from the etching chamber 1a out to the transfer chamber 3 and the gate valve G is closed, the direct current is applied to the electrode 22 embedded in the electrostatic chuck 21 from the DC power supply 23 to electrostatically adsorb the wafer W to the electrostatic chuck 21 by the electrostatic force, such as the Coulomb force or the Johnsen-Rahbek force (step 5). Furthermore, the etching chamber 1a is preset to have a lower ambient pressure than that of the transfer chamber 3, thereby preventing small amounts of residual gas containing F from flowing from the etching chamber 1a into the transfer chamber 3 when the gate valve G is opened.

Figure 5A:
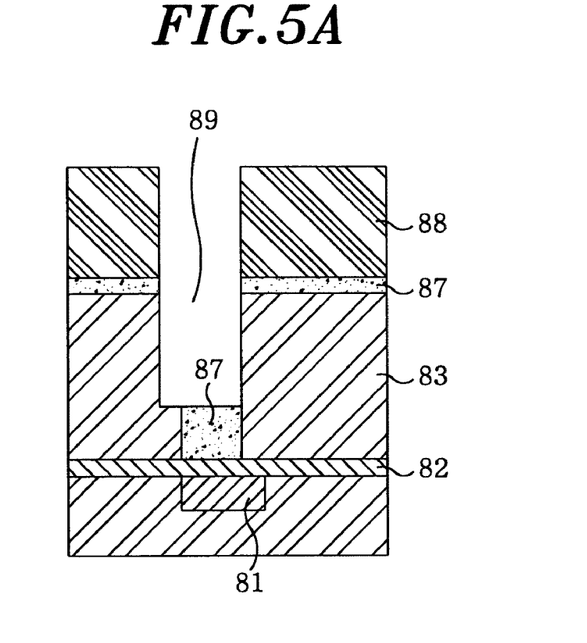
FIGS. 5A and 5B are cross sectional views illustrating states in which trench-etching, ashing, and liner-removal of the substrate shown in FIG. 3 are performed.

Thereafter, the valves 39 are opened to supply an etching gas of a predetermined flow rate from the etching gas source 40 through the shower head 31 into the chamber 12, and the gas exhaust unit 45 is controlled to maintain an ambient pressure of the chamber 12 ranging from about 1 to about 10 Pa. The high frequency power is applied from the high frequency power supply 50 and the high frequency power supply 60 to the shower head 31 serving as the upper electrode and the susceptor 15 serving as the lower electrode, respectively, enabling a generation of a plasma with the etching gas in order to etch the low-k film 83 of the wafer W to form the trench 89 on the wafer W (step 6), as shown in FIG. 5A.

After the completion of the etching process, the supplying of the etching gas into the chamber 12 along with the application of the direct current to the electrostatic chuck 21 is stopped (step 7). The chamber 12 is then purged using a purge gas (step 8).

Despite ceased supply of the direct current to the electrostatic chuck 21, the charge remains on the wafer W. At such state, there is a great difficulty in separating the wafer W from the electrostatic chuck 21. In addition, when the wafer W is placed on the hand 7 of the wafer transfer mechanism 6, the wafer W is easily misplaced on the hand 7. Accordingly, there remains a need to remove the charge on the wafer W. In accordance with the first embodiment of the present invention, the $N_2$ gas is supplied from the $N_2$ gas supply source 70 through the shower head 31 into the chamber 12, while the ultraviolet ray is irradiated from the ultraviolet irradiation unit 75 to the $N_2$ gas to convert the $N_2$ gas into the monatomic N atoms. As a result, the monatomic N atoms are supplied into the chamber 12 to remove the charge on the wafer W on the electrostatic chuck 21 (step 9).

Upon completion of removal of the wafer W, a pressure of the chamber 12 is adjusted; the gate valve G is opened; and the lift pin 24 emerges from the electrostatic chuck 21 to lift the wafer W from the electrostatic chuck 21. The hand 7 of the wafer transfer mechanism 6 is inserted into the chamber 12 to receive the wafer W (step 10).

Then, the wafer W is transferred from the etching chamber 1a into the transfer chamber 3, and is placed on the aligning unit 8 to be aligned. Thereafter, the wafer W is transferred using the wafer transfer mechanism 6 to a position in the transfer chamber 3 adjacent to an ashing chamber 2a, a gate valve G between the ashing chamber 2a and the transfer chamber 3 is opened, and the wafer W is transferred into the ashing chamber 2a (step 11). The wafer W is placed on an electrostatic chuck in the ashing chamber 2a (step 12). Similar to the case of etching chamber 1a, the wafer W is electrostatically adsorbed to the electrostatic chuck (step 13). Additionally, the ashing gas, such as $O_2$ gas, is used in the ashing process. Because the ashing process is conducted at higher pressure than in the case of the etching process, the ashing chamber 2a has higher ambient pressure than the transfer chamber 3, thereby preventing the compounds, containing F, from flowing from the transfer chamber 3 into the ashing chamber 2a.

Figure 5B:
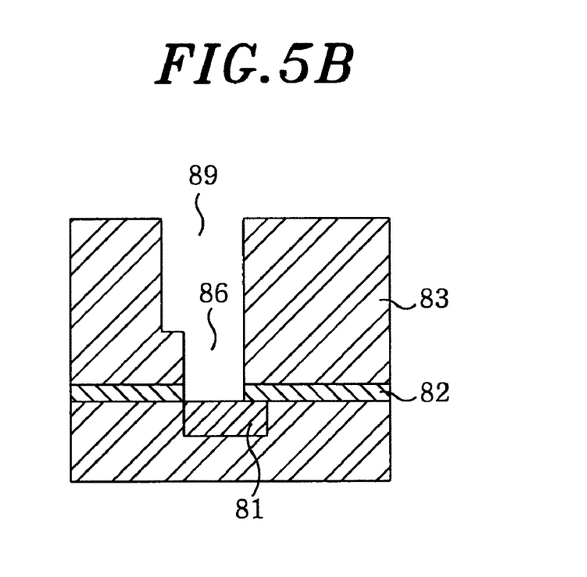

Similar to the etching process, the ashing gas of a predetermined flow rate is supplied from an ashing gas source (not shown) through the shower head 31 into the chamber 12, and the gas exhaust unit 45 is controlled to maintain an ambient pressure of the chamber 12 ranging from 10 to 20 Pa. Additionally, the ashing gas is converted into a plasma to remove the sacrificial film 87 and a resist film 88 through the ashing process and to simultaneously remove an exposed portion of the liner layer 82 (step 14), as shown in FIG. 5B.

Upon completion of the ashing process, the supplying of the ashing gas into the chamber 12 is stopped and the application of the direct current to the electrostatic chuck 21 is simultaneously stopped (step 15). The chamber 12 of the ashing chamber 2a is then purged using the purge gas (step 16). Subsequently, charge on the wafer W adsorbed to the electrostatic chuck 21 is subject to charge removal (step 17), similar to the etching process.

Upon completion of the charge removal on the wafer W, pressure of the chamber 12 is adjusted, and the gate valve G is opened. The hand 7 of the wafer transfer mechanism 6 then receives the wafer W from the electrostatic chuck 21 and transfers the wafer W into the cassette 5 of the wafer cassette chamber 4a or 4b (step 18), thereby completing the etching and ashing of the single wafer W.

While above wafer W is subject to the etching process in the etching chamber 1a, a wafer W is transferred by use of the wafer transfer mechanism 6 into the etching chamber 1b to be etched and then transferred from the etching chamber 1b into the ashing chamber 2b to be ashed. In other words, the etching and ashing processes are conducted using the two sets of etching chambers and ashing chambers, thereby ensuring a relatively high throughput.

The dissociated monatomic N atoms are used to remove the charge on the wafer W. The monatomic N atoms do not incur damages to the wafer W unlike nitrogen ions and plasmas, while quickly and reliably capturing electrons from the wafer W by merely supplying same to the wafer W. Specifically, because the dissociated monatomic N atoms have lower energy than the nitrogen ions and plasmas, damage to the wafer W by the monatomic N atoms is relatively small. Additionally, since dissociation energy of nitrogen is lower than energy required to convert nitrogen molecules into the nitrogen ions or plasmas, and the monatomic N atoms have relatively high electronegativity, the monatomic N atoms easily capture the electrons from the wafer W, and thus quickly and reliably removing the charge on the wafer W. Accordingly, the multichamber-type processing apparatus 100 ensures excellent accuracy and throughput.

In this respect, energy of the ultraviolet ray required to produce the dissociated monatomic N atoms is controlled to be higher than the dissociation energy of $N_2$ and less than ionization energy of $N_2$, so as to effectively convert the $N_2$ gas into the monatomic N atoms without ionizing the $N_2$ gas. Specifically, since the dissociation energy of $N_2$ is about 9.8 eV at 0 K and the ionization energy of $N_2$ is about 15.6 eV at 0 K, it is preferable that the energy of the ultraviolet ray irradiated to the $N_2$ gas be about 9.8 to about 15.6 eV at a temperature of 0 K.

Furthermore, since the etching chambers 1a, 1b each have lower ambient pressure than the transfer chamber 3 and the ashing chambers 2a, 2b each have higher ambient pressure than the transfer chamber 3, even a small amount of residual etching gas in etching chambers 1a, 1b, which contains halogen gas is prevented from flowing into the transfer chamber 3. Additionally, even in a case of the etching gas leaking from the etching chambers 1a, 1b into the transfer chamber 3, the flow of the etching gas from the transfer chamber 3 into the ashing chambers 2a, 2b is substantially prevented. In case that the Cu wire is applied to the wafer W, due to very high reactivity of Cu, it is vital to prevent the etching gas from flowing into the ashing chambers 2a, 2b, in which Cu is exposed to the atmosphere Furthermore, since the trench etching; and the ashing and liner removal are conducted in different chambers, it is possible to avoid the deterioration in etching selectivity due to the residual gas when the trench etching is performed, the ashing and liner removal are conducted in the same chamber, thereby ensuring excellent throughput.

As well, the misalignment between the hand 7 and the wafer W is easily overcome by the charge removal of the wafer W, thereby improving accuracy in aligning the wafer W with the hand 7. Moreover, in the present invention, the aligning unit 8 is installed in the transfer chamber 3 to align the wafer W with the hand 7, thereby further improving accuracy in aligning the wafer W with the hand 7.

Figure 6:
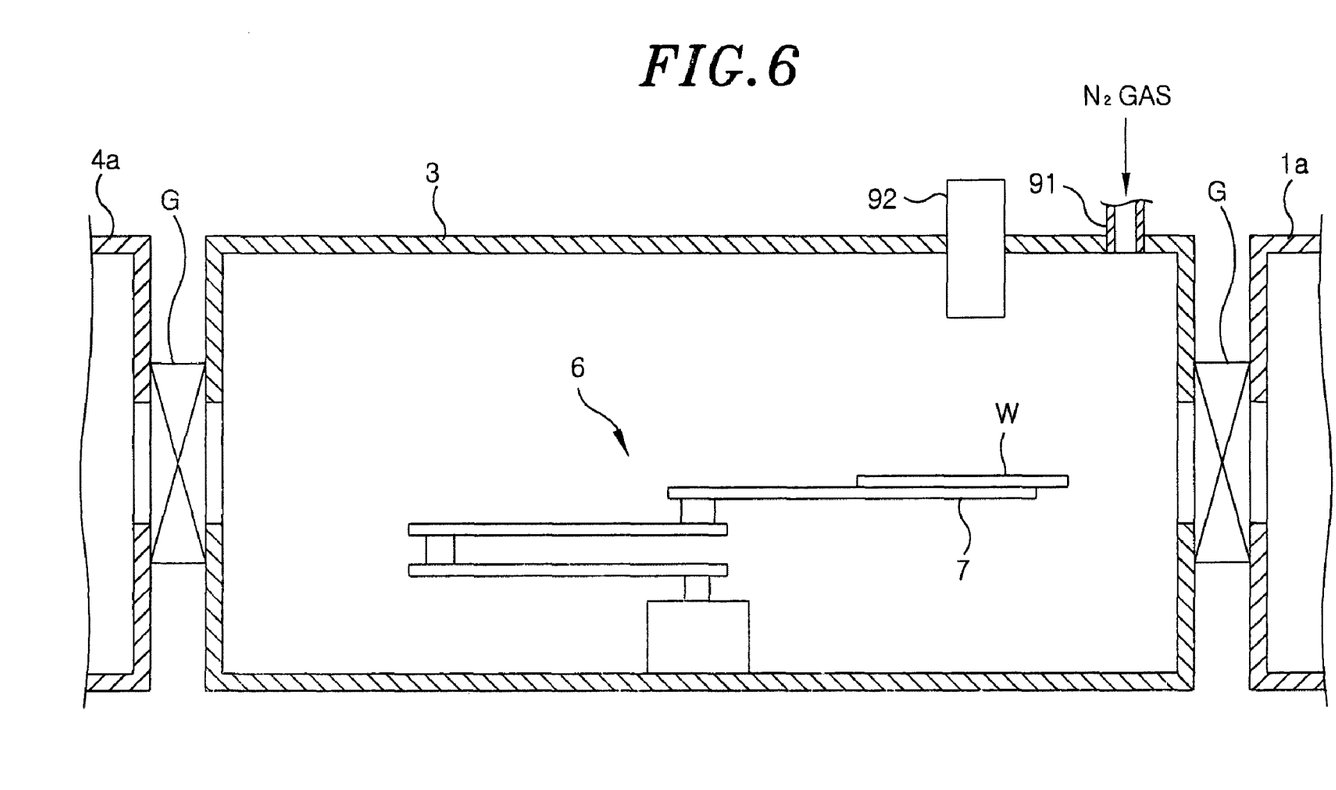
FIG. 6 is a cross sectional view of a transfer chamber capable of being neutralized.

As described above, the charge removal of the wafer W removes a remaining electric charge from the wafer W on the electrostatic chuck, but the electric charge negatively affects the wafer W when the hand 7 is electrically charged. Therefore, charge on the hand 7 may be preferably removed before or after the wafer W is loaded from the hand 7 to the electrostatic chuck 21; at the time when the wafer W is loaded from the hand 7 to the electrostatic chuck 21; before or after the hand 7 receives the wafer W from the electrostatic chuck 21; or at the time when the hand 7 receives the wafer W from the electrostatic chuck 21. As shown in FIG. 6, an $N_2$ gas inlet 91 and an ultraviolet irradiation unit 92 may be installed in the transfer chamber 3 to remove the charge on the hand 7 and wafer W in the transfer chamber 3. In the present invention, the $N_2$ gas supply source 70 and the etching gas source 40 are separately installed in the processing apparatus 100, but the etching gas may be supplied through the $N_2$ gas supply source 70 into the chamber 12 in the case of using the $N_2$ gas as the etching gas.

Figure 7:
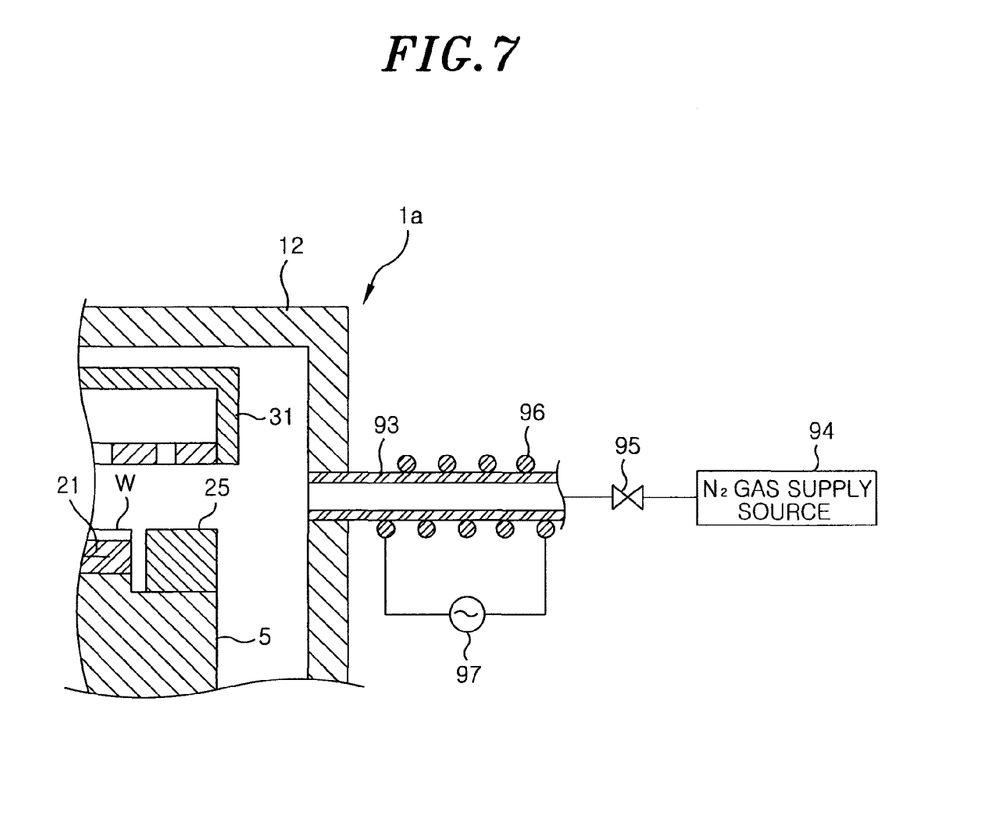
FIG. 7 is a cross sectional view illustrating part of another etching chamber using a monatomic nitrogen atom supply unit.

With reference to FIG. 7, there is illustrated another etching chamber using a monatomic nitrogen atom supply unit. In FIGS. 2 and 7, the same reference numerals refer to the same elements throughout, and description thereof is omitted. As shown in FIG. 7, an end of a gas pipe 93 made of a dielectric material communicates with the inside of the chamber 12 through a sidewall of the chamber 12, and the other end of the gas pipe 93 is connected to a $N_2$ gas supply source 94. At this time, the wafer W in the chamber 12 is positioned close to the gas pipe 93. In addition, an induction coil 96 is wound around the gas pipe 93, and the high frequency power is applied from a high frequency power supply 97 to the induction coil 96. Further, a valve 95 is installed at the gas pipe 93.

In the etching chamber 12 of FIG. 7, the valve 95 is opened to supply the $N_2$ gas from the $N_2$ gas supply source 94 through the gas pipe 93 into the etching chamber 12, and the high frequency is simultaneously applied from the high frequency power supply 97 to the induction coil 96. Thereby, the $N_2$ gas passing through the gas pipe 93 is dissociated to the monatomic N atoms due to an electromagnetic induction, and thus the monatomic N atoms are supplied into the chamber 12. Accordingly, the wafer W is effectively neutralized without being damaged. At this time, energy applied from the high frequency power supply 97 to the induction coil 96 is higher than the dissociation energy of $N_2$ and less than the ionization energy of $N_2$.

Numerous modifications and variations of the present invention are possible in light of the above teachings. For instance, in the present invention, the processing apparatus is described to include the two etching chambers and the two ashing chambers, however, it may only include one etching chamber and one ashing chamber, or the three or more etching chambers and the three or more ashing chambers.

Additionally, in the present invention, only the trench etching and ashing processes according to the dual damascene structure are disclosed. However, the present invention may be applied to etching and ashing processes for other structures. Further, the present invention may be applied to a repeating processing of different types of etching processes. Furthermore, the present invention may be applied to a film-formation process as well as the etching and ashing processes. Moreover, a unit for supplying the dissociated monatomic N atoms into the chamber can be variously modified within the scope of the appended claims.

Moreover, in the present invention, the semiconductor wafer is used as a substrate, but the present invention may be applied to the other substrates, such as glass substrates for LCD.

As illustrated by the above description, the present invention provides a multichamber-type processing apparatus, which includes the transfer chamber and the processing chambers connected thereto, in which dissociated monatomic N atoms are supplied into the processing chambers. Accordingly, the substrate electrostatically adsorbed to an electrostatic chuck is quickly and reliably neutralized by relatively low energy without being damaged, thereby ensuring excellent accuracy and throughput.

While the invention has been shown and descried with respect to the preferred embodiments, it will be understood by those skilled in the art that various changes and modifications may be made without departing from the spirit ands scope of the invention as defined in the following claims.

What is claimed is:

1. A processing method employing a processing apparatus, which includes a transfer chamber, a processing chamber coupled to the transfer chamber, to process therein a target substrate, and an electrostatic chuck provided in the processing chamber to electrostatically adsorb the target substrate thereto, comprising:

transferring the target substrate from the transfer chamber into the processing chamber by using a transfer mechanism;

placing the target substrate on the electrostatic chuck displaced in the processing chamber;

applying a direct current to an electrode embedded in the electrostatic chuck to electrostatically absorb the target substrate to the electrostatic chuck;

processing the target substrate in the processing chamber, to thereby obtain a processed substrate;

terminating the application of the direct current to the electrostatic chuck;

supplying an $N_2$ gas into the processing chamber through a shower head installed at an upper part of the processing chamber;

irradiating ultraviolet rays to the $N_2$ gas by using an ultraviolet irradiation unit provided at a sidewall of the processing chamber such that dissociated monatomic nitrogen atoms are generated to remove charge on the electrostatic chuck; and transferring the processed substrate into the transfer chamber using the transfer mechanism, wherein the dissociated monatomic nitrogen atoms are produced by applying energy, higher than dissociation energy of $N_2$ and lower than ionization energy of $N_2$, to the $N_2$ gas.

2. The processing method of claim 1, wherein the ultraviolet irradiation unit is positioned close to the electrostatic chuck.

3. The processing method of claim 1, further comprising generating dissociated monatomic nitrogen atoms in the transfer chamber.

4. A processing method using a processing apparatus, which includes a transfer chamber, a first processing chamber coupled to the transfer chamber, for performing a first process on a target substrate therein, a second processing chamber coupled to the transfer chamber for performing a second process on the target substrate therein, and a first and second electrostatic chucks provided in the first and second processing chambers, respectively, to electrostatically adsorb the substrate thereto, comprising:

transferring the target substrate from the transfer chamber into the first processing chamber using a transfer mechanism;

placing the target substrate on the first electrostatic chuck in the first processing chamber;

applying a direct current to an electrode of the first electrostatic chuck to electrostatically adsorb the target substrate to the first electrostatic chuck;

performing a first process on the target substrate in the first processing chamber to thereby obtain a processed substrate;

terminating the application of the direct current to the first electrostatic chuck;

supplying an $N_2$ gas into the first processing chamber through a shower head installed at an upper part of the first processing chamber;

irradiating ultraviolet rays to the $N_2$ gas by using an ultraviolet irradiation unit provided at a sidewall of the first processing chamber such that dissociated monatomic nitrogen atoms are generated to remove charge on the first electrostatic chuck;

transferring the processed substrate into the transfer chamber using the transfer mechanism;

transferring the processed substrate from the transfer chamber into the second processing chamber;

placing the processed substrate on the second electrostatic chuck in the second processing chamber;

applying the direct current to an electrode of the second electrostatic chuck to electrostatically adsorb the processed substrate to the second electrostatic chuck; and performing a second process on the processed substrate in the processed second processing chamber, wherein the dissociated monatomic nitrogen atoms are produced by applying energy, higher than dissociation energy of $N_2$ and lower than ionization energy of $N_2$ to the $N_2$ gas.

5. The processing method of claim 4, wherein the ultraviolet irradiation unit is positioned close to the first electrostatic chuck.

6. The processing method of claim 4, further comprising generating dissociated monatomic nitrogen atoms in the transfer chamber.

7. A processing method employing a processing apparatus, which includes a transfer chamber, a processing chamber coupled to the transfer chamber, to process therein a target substrate, and an electrostatic chuck provided in the processing chamber to electrostatically adsorb the target substrate thereto, comprising:

transferring the target substrate from the transfer chamber into the processing chamber by using a transfer mechanism;

placing the target substrate on the electrostatic chuck displaced in the processing chamber;

applying a direct current to an electrode embedded in the electrostatic chuck to electrostatically adsorb the target substrate to the electrostatic chuck;

processing the target substrate in the processing chamber, to thereby obtain a processed substrate;

terminating the application of the direct current to the electrostatic chuck;

generating monatomic nitrogen atoms dissociated by using an ultraviolet irradiation unit provided at a sidewall of the processing chamber to remove charge on the electrostatic chuck; and transferring the processed substrate into the transfer chamber using the transfer mechanism, wherein the dissociated monatomic nitrogen atoms are produced by applying energy, higher than dissociation energy of $N_2$ and lower than ionization energy of $N_2$, to the $N_2$ gas.

8. The processing method of clam 7, wherein the dissociated monatomic nitrogen atoms are generated near the electrostatic chuck.

9. The processing method of claim 7, further comprising generating dissociated monatomic nitrogen atoms into the transfer chamber.

10. A processing method using a processing apparatus, which includes a transfer chamber, a first processing chamber coupled to the transfer chamber, for performing a first process on a target substrate therein, a second processing chamber coupled to the transfer chamber for performing a second process on the target substrate therein, and a first and second electrostatic chucks provided in the first and second processing chambers, respectively, to electrostatically adsorb the substrate thereto, comprising:

transferring the target substrate from the transfer chamber into the first processing chamber using a transfer mechanism;

placing the target substrate on the first electrostatic chuck in the first processing chamber;

applying a direct current to an electrode of the first electrostatic chuck to electrostatically adsorb the target substrate to the first electrostatic chuck;

performing a first process on the target substrate in the first processing chamber to thereby obtain a processed substrate;

terminating the application of the direct current to the first electrostatic chuck;

generating monatomic nitrogen atoms dissociated by using an ultraviolet irradiation unit provided at a sidewall of the first processing chamber to remove charge on the first electrostatic chuck;

transferring the processed substrate into the transfer chamber using the transfer mechanism;

transferring the processed substrate from the transfer chamber into the second processing chamber;

placing the processed substrate on the second electrostatic chuck in the second processing chamber;

applying the direct current to an electrode of the second electrostatic chuck to electrostatically adsorb the processed substrate to the second electrostatic chuck; and performing a second process on the processed substrate in the processed second processing chamber, wherein the dissociated monatomic nitrogen atoms are produced by applying energy, higher than dissociation energy of $N_2$ and lower than ionization energy of $N_2$, to the $N_2$ gas.

11. The processing method of claim 10, wherein the dissociated monatomic nitrogen atoms are generated near the electrostatic chucks.

12. The processing method of claim 10, further comprising generating dissociated monatomic nitrogen atoms in the transfer chamber.

* * * * *